Jan. 16, 1951 L. H. BEDFORD ET AL 2,538,439

TUNING SYSTEM FOR RESONANT CIRCUITS

Original Filed Feb. 25, 1944

Inventors
LESLIE HERBERT BEDFORD
ARTHUR HENRY ASHFORD WYNN

By Ralph B. Stewart

Attorney

Patented Jan. 16, 1951 2,538,439

UNITED STATES PATENT OFFICE 2,538,439

TUNING SYSTEM FOR RESONANT CIRCUITS

Leslie Herbert Bedford, London, and Arthur Henry Ashford Wynn, Sheffield, England, assignors to A. C. Cossor Limited, London, England, a British company Continuation of application Serial No. 523,890, February 25, 1944. This application April 13, 1949, Serial No. 87,268. In Great Britain February 26, 1943

6 Claims. (Cl. 250—40)

This invention relates to tuning systems for resonant electric circuits, and is particularly applicable to radio equipment intended for operation on frequencies of the order of megacycles or tens of megacycles.

One feature of the invention is a resonant circuit which is capable of having its tuning varied, continuously or in steps, over a range, and which is so arranged that at any setting of its tuning it is possible, by a simple switching operation, to change the resonant frequency by a predetermined small amount independent of the setting.

Another feature of the invention is a resonant circuit wherein the rate of change of resonant frequency, over a small range, with variations of one of the variable capacitances comprised therein, is independent of the absolute value of the resonant frequency when this is varied by changes of other capacitances in the circuit.

Another feature of the invention is concerned with means for easily and accurately tuning oscillators. According to this feature, an oscillator is provided with a step-by-step coarse tuning control and a fine tuning control, and also with a trimming control for adjusting the resonant frequency at any setting of the coarse tuning control. While such adjustment is carried out, the fine tuning control is set either at zero or at some other predetermined setting independent of the setting of the coarse tuning control. The fine tuning control is so designed that its own calibration is substantially correct for all settings of the coarse tuning control.

Another feature of the invention is the provision of simple means for comparing the resonant frequency of such an oscillator with a standard frequency at every setting of the coarse tuning control, so that the trimming control can be adjusted correctly for that setting.

This application is a continuation of our abandoned earlier filed application, Serial No. 523,890, filed February 25, 1944, and certain subject matter of the earlier filed application is also being claimed in application, Serial No. 75,412, filed February 9, 1949.

Figure 1:
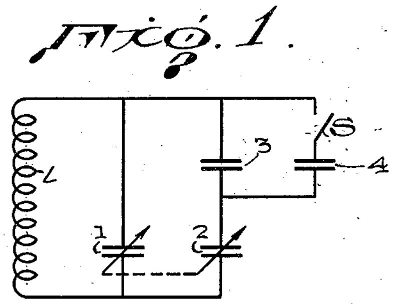
Figures 2, 3:
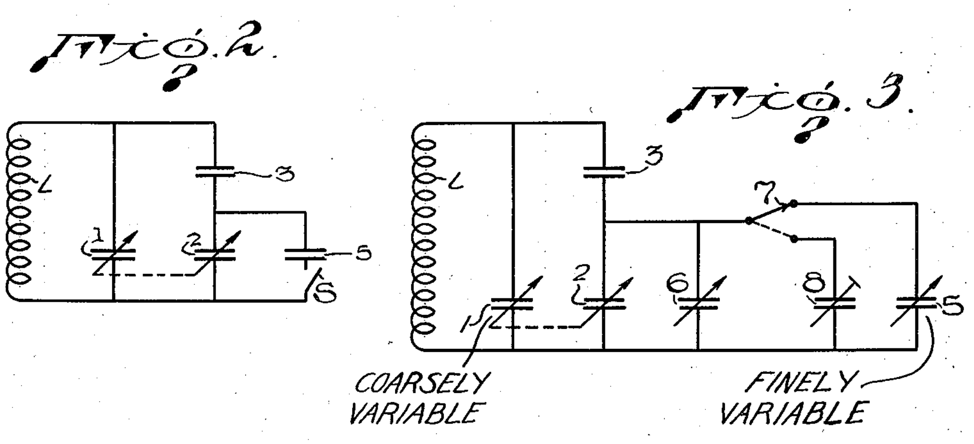
Figure 4:
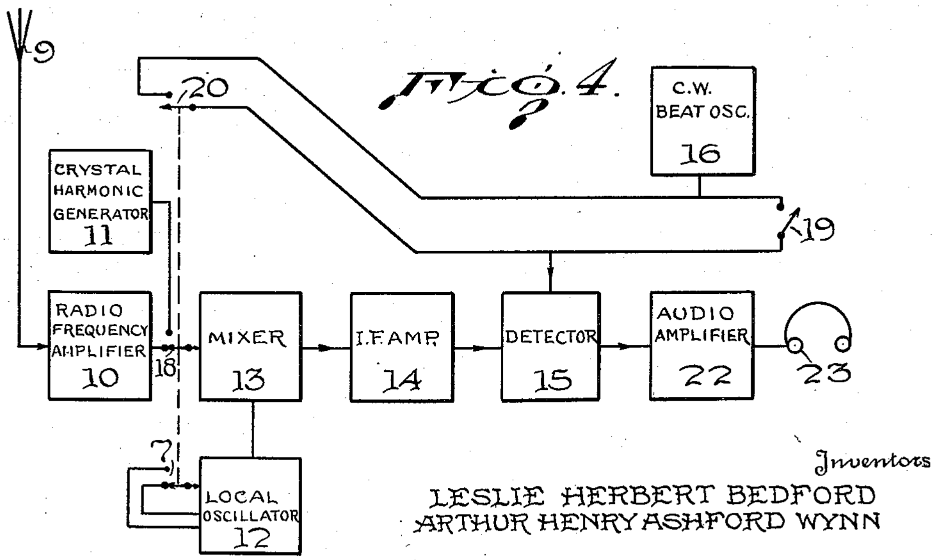

In the accompanying drawings, Figures 1 and 2 are circuit diagrams of variably tunable resonant circuits with alternative arrangements for changing the resonant frequency, by the operation of a switch, by a fixed amount independent of the tuning of the circuit; Figure 3 is a circuit diagram of a variably tunable resonant circuit having coarse and fine tuning controls, and in which the calibration of the fine tuning control is substantially independent of the setting of the coarse tuning control; and Figure 4 is a schematic diagram of a superheterodyne radio receiver, the local oscillator of which has a tank circuit corresponding to Figure 3.

Circuits such as are shown in Figures 1 and 2 are required in high frequency radio equipment which serves alternately as a transmitter and as a superheterodyne receiver, both operating on the same signal frequency, and wherein the same oscillator is used for sending and receiving. In such an equipment, the resonant frequency must be changed, by an amount equal to the relatively small intermediate frequency, when switching over from sending to receiving. In each of the circuits shown, this result is achieved by switching an additional condenser into or out of circuit.

In the arrangement of Figure 1 an inductance L is tuned by the resultant capacity of a network of condensers 1, 2, 3 and 4, the condenser 4 being connected in parallel with the condenser 3 through a switch S which may be opened or closed to provide a predetermined change in the resonant frequency of the circuit. The condensers 1 and 2 are variable and ganged together, and in order to ensure that the frequency change brought about by actuation of the switch S is constant and independent of the setting of the two ganged condensers 1 and 2, it is arranged that the laws relating change of capacitance with change in setting of the ganging means is different for the two condensers 1 and 2.

The inter-relationship of these two laws may conveniently be expressed by the equation $$C_2=\frac{A}{B}+\sqrt{\frac{A^2}{B^2}+\frac{C_3(C_3+C_4)}{B}}$$

where $C_2$ is the capacity of condenser 2, $$A=\frac{2C_3+C_4}{2}$$

$C_3$ is the capacity of condenser 3,
$C_4$ is the capacity of condenser 4, $$B=\frac{C_4}{C}-1$$

$$C=\frac{1}{4\pi^2L}\left[\frac{1}{f^2}-\frac{1}{(f+F)^2}\right]$$

$f$ is the resonant frequency, that is to say $$\frac{1}{2\pi\sqrt{LC_x}}$$

where Cx is the resultant capacity of condensers 1, 2 and 3

$$\left(C_1+\frac{C_2C_3}{C_2+C_3}\right)$$

L is the value of inductance L, and
F is the fixed frequency change effected by closing switch S.

The vane shapes of condenser 2 will, of course, depend upon the vane shapes of condenser 1. If condenser 1 has a straight-line-capacity law and the maximum values of condensers 1 and 2 are fairly nearly equal, the vane shapes for condenser 2 are particularly convenient.

In practice small trimming condensers will usually be provided in parallel with condensers 2 and 3 for final adjustments of the circuits so that the tracking is as nearly accurate as possible.

In the alternative arrangement shown in Figure 2, switch S connects a fixed condenser 5 in parallel with condenser 2. This arrangement has an advantage over that shown in Figure 1 in that the switch can be connected to one side of each of the variable condensers 1 and 2, and in practice may therefore be earthed. The vane shapes, however, although practicable, become more awkward than those obtained with Figure 1, and it is preferred to arrange that condenser 1 has a straight-line-capacity law and that the maximum values of condensers 1 and 2 are fairly equal. The law relating the capacity of condenser 2 with frequency in this example takes the form:

$$C_2=\sqrt{\frac{C_5^2}{4}+\frac{C_3^2C_5}{C}}-\left(C_3+\frac{C_5}{2}\right)$$

where $C_5$ is the capacitance of condenser 5.

The capacities of the condensers 4 and 5 in the arrangements of Figures 1 and 2 respectively may be of the same order as that of condenser 3 and may assist in swamping stray capacities.

The circuit shown in Figure 3 is generally similar in principle to that of Figure 2, but the tuning is variable over a range by a fine tuning control having fixed calibration, instead of being merely capable of a fixed change by a switching operation. The fixed condenser which is switched into and out of circuit in the arrangements of Figures 1 and 2 becomes, for this purpose, a variable condenser, preferably of straight-line-capacity law.

In the circuit illustrated in Figure 3, the coarse tuning of inductance L is effected by variable condenser 1, which is one of the sections of a ganged condenser controlled by the coarse tuning control knob. This control is preferably provided with a step-by-step mechanism whereby approximately equal frequency steps of, say, 0.1 megacycle per second each may be effected.

The fine tuning of the circuit is effected by variable condenser 5. It will normally be convenient that the full range of frequency change produced by condenser 5 shall be equal to the frequency change produced by moving the control of condenser 1 through one step. The control of condenser 5 may also be provided with a step-by-step mechanism, whereby for each step the change of frequency is, say, 0.01 mc./s.

In order to achieve that the rate of change of frequency with change of capacity of condenser 5 shall be independent of the setting of condenser 1, condenser 5 is connected across one half of the chain of condensers 2 and 3, which are connected in series across condenser 1 and one of which, condenser 2, is ganged with condenser 1. The required result is then approximately achieved if the capacity of condenser 2 varies with that of condenser 1 in accordance with a special law.

Condenser 6 is provided in parallel with the fine tuning condenser 5 for the purpose of trimming the tuning to correct for errors in the calibration of condenser 1. It is convenient that trimming condenser 6 should have a range of frequency correction of the order of plus or minus half the frequency change corresponding to one step of condenser 1. This range of correction should be substantially independent of the setting of condenser 1, and this is achieved by connecting condenser 6 across condenser 2 in the same manner as condenser 5 is connected. An incidental advantage of connecting the fine tuning condenser 5 and the trimming condenser 6 in parallel with one half of the chain of condensers 2 and 3 is that they are not then required to be so unreasonably small as they would be if connected directly in parallel with condenser 1.

Means should be provided for checking the calibration of the control of condenser 1 at every step in its range. This may be done by comparison with standard frequencies which will usually correspond, at all steps of condenser 1, either to the zero setting of the fine tuning control 5, or else to some other single setting thereof such as its mid-setting. It is desirable to obviate the necessity of always turning the fine tuning control to this setting before calibrating; and to this end pre-set condenser 8 is provided, together with a switch 7 whereby it may be substituted for condenser 5. Switch 7 may be ganged with a switch which brings into action the system for comparison with the standard. These switches may be operated by depressing a knob which then becomes effective, by subsequent rotation, to adjust condenser 6. Condenser 8 is pre-set to the value corresponding to the capacity of condenser 5 when at its zero setting, or other selected setting, due allowance being made for any change in stray capacities resulting from the change-over.

The greater the ratio of maximum capacity of condenser 2 to maximum capacity of condenser 1 is made, the nearer is it possible to approach the ideal that the true calibration of condenser 5 in frequency increment should be independent of the setting of condenser 1. In practice, however, it is not convenient to make the maximum capacity of condenser 2 appreciably larger than that of condenser 1, and it is found that the greatest error in the calibration of the fine tuning control under this condition relative to the maximum resonant frequency of the circuit need not exceed the order of 1 in 10,000.

In one specific example, where the circuit is tuned over the range 4.45 to 7.45 mc./s., the condensers have the following values in picofarads (micro-micro-farads):

| | Picofarads |
|---|---|
| Fixed condenser 3 | 150 |
| Variable condenser 5 | 0–50 |
| Trimmer condenser 6 | 0.40 |

Corresponding capacities of condenser 1 (including strays) and condenser 2 (including strays across itself and across condensers 5 and 6) lie on a smooth curve through the following points:

| | | | | | | | | |
|---|---|---|---|---|---|---|---|---|
| Capacity of condenser 1 (pf.) | 46 | 100 | 150 | 200 | 250 | 300 | 350 | 375 |
| Capacity of condenser 2 (pf.) | 335 | 237 | 180 | 141 | 110 | 84 | 62 | 53 |

The superheterodyne radio receiver illustrated by Figure 4 has a receiving aerial 9, a radio frequency amplifier 10, a local oscillator 12, a mixer 13, an intermediate frequency amplifier 14, a detector 15, an audio amplifier 22 and a sound reproducing device shown as headphones 23, all in conventional arrangement. It is also provided, in conventional manner, with a beat oscillator capable of generating oscillations at and about the intermediate frequency, for the reception of C. W. telegraphy, and with a switch 19 for bringing this into or out of circuit according to whether telegraphy or telephony is to be received.

In addition, this receiver is provided with a crystal harmonic generator 11 and with ganged switches 7, 18, 20.

The local oscillator 12 has a tank circuit of the form illustrated in Figure 3 and switch 7 corresponds with switch 7 of Figure 3. Tuning condensers in radio frequency amplifier 10 will be ganged with condensers 1 and 2 and with condenser 5.

The ganged switches 7, 18 and 20 are shown in the attitude for radio reception. When they are thrown to the alternative attitude, switch 7 substitutes pre-set condenser 8 for condenser 5, switch 18 disconnects the signal input circuit comprising radio frequency amplifier 10 from the mixer 13 and substitutes crystal harmonic generator 11, and switch 20 connects the beat oscillator 16 to the input of detector 15 in the same manner as does switch 19. In this alternative attitude, the circuits are connected for checking and correcting the coarse control of the local oscillator frequency, whatever its setting and independently of the setting of the fine tuning control.

It will be assumed by way of example that the radio receiver is required to operate over a radio frequency range from 4 to 7 mc./s., and that the coarse tuning control has a step-by-step mechanism whereby it may be set for the reception of any frequency within this range which is an integral multiple of 0.1 mc./s. The intermediate frequency should be a low odd multiple of half this frequency step, i. e. a low odd multiple of 50 kc./s., say, 450 kc./s. The crystal harmonic generator 11 will be required to produce a substantial output at all frequencies near the range of tuning of the local oscillator, which are even multiples of said frequency step, i. e. at every frequency near the range 4 to 7 mc./s., which is a harmonic of 200 kc./s. When the ganged switches 7, 18, 20 are thrown to the attitude for calibration, and the oscillation from local oscillator 12 is mixed with the output from crystal harmonic generator 11, the intermediate frequency amplifier 14 passes only those difference beat frequencies which are near to 450 kc./s. It will be found that, for any two adjacent settings of the coarse control of the local oscillator, one will beat with a higher crystal harmonic and the other with a low crystal harmonic to produce a difference beat frequency which, when the trimming is correct, will be equal to the intermediate frequency. This will be seen from the following table. The first column shows the calibrations of a series of adjacent settings of the coarse tuning control. This is, of course, calibrated in terms of the radio frequency to be received. The second column shows the actual local oscillator frequencies corresponding to these settings. The third column shows the crystal harmonic frequencies, all being harmonics of 200 kc./s., which will beat with the local oscillator frequencies to produce difference beat frequencies of 450 kc./s.

| Radio Signal frequency, mc./s. | Local Oscillator frequency, mc./s. | Crystal Harmonic frequency, mc./s. |
|---|---|---|
| 5.5 | 5.050 | 4.6 |
| 5.6 | 5.150 | 5.6 |
| 5.7 | 5.250 | 4.8 |
| 5.8 | 5.350 | 5.8 |
| 5.9 | 5.450 | 5.0 |

In this example, it is assumed that the local oscillator frequencies are on the lower side of the radio frequencies; but the same result will be obtained if they are on the higher side.

In the detector 15, the output of intermediate frequency amplifier 14 is mixed with that of beat oscillator 16. This beat oscillator 16 will have a frequency variable over a range of a few kc./s. for the selection of a preferred pitch for C. W. telegraphy reception. Its frequency control may have a "click" position for approximately 450 kc./s., in which position it will be placed when calibrating. The probable error in this setting is so small relative to the radio frequency that no great accuracy of setting or stability in the best oscillator is required. The difference beat frequency between the output of beat oscillator 16 and the output of intermediate frequency amplifier 14 will represent the error in tuning of the local oscillator. This beat frequency can be heard in the headphones 23, and the trimming condenser 6 can be adjusted until the beat frequency is approximately zero.

For an alternative method of checking and correcting the frequencies of the oscillations generated with the various settings of condenser 1, the crystal harmonic generator 11 is required to produce a substantial output at every odd multiple, as well as at every even multiple, of the frequency step of 100 kc./s.; but in this case switch 20 is dispensed with, because the beat oscillator 16 is not employed in the calibrating process. The intermediate frequency is preferably again a low odd multiple of half the frequency step, again say 450 kc./s.

When the frequency of the local oscillator 12 is near to an odd multiple of 50 kc./s., two of the difference beat frequency components will pass the intermediate frequency amplifier. One of these will be the difference beat between the oscillation to be checked and a crystal harmonic of high frequency, and the other between said oscillation and a crystal harmonic of lower frequency. For example, if the frequency of the local oscillator 12 is 6053 kc./s. and the pass band of the intermediate frequency amplifier is 450±5 kc./s., then the beat frequencies passing to the detector 15 will be 447 and 453 kc./s., produced respectively by the beating of the local oscillator output against the crystal harmonics of frequency 6500 and 5600.

The two difference beat frequencies passing the intermediate frequency amplifier will themselves interact to produce a beat signal of difference frequency which, in this example, will be 6 kc./s.

This will be heard in the headphones 23, and trimming condenser 6 will be adjusted to correct the frequency of the local oscillator 12 until this beat frequency is reduced approximately to zero.

In this last arrangement, if the intermediate frequency amplifier is tuned to an even multiple of half the frequency step, say to 400 kc./s., a low crystal harmonic at that frequency will come through and beat with the two difference beat frequencies, which will be equally spaced from this intermediate frequency, one below and the other above. The only difference in effect will be that the final note will be halved in fundamental frequency.

In the superheterodyne radio receiver illustrated in Figure 4, it is not essential to use, as the tank circuit in the local oscillator 12, a circuit such as that shown in Figure 3. The required independence between the calibration of the fine tuning control and the setting of the coarse tuning control can be achieved by using for the coarse tuning a straight-line-frequency variable condenser and by providing mechanical gearing whereby the normally stationary member of that condenser is rocked through a small angle by the fine tuning control. Resilient means should be provided to permit this normally stationary member to be returned to its zero or other predetermined attitude, independently of the setting of the fine tuning control knob, when the calibrating system is brought into operation.

The superheterodyne receiver illustrated in Figure 4 will serve very satisfactorily as a wavemeter. The signal, the frequency of which is to be determined, is applied to the radio frequency amplifier 10, and the coarse and fine tuning controls are adjusted until the signal comes through at maximum strength in the headphones 23. When the required setting of the coarse tuning control has been found, the switches 7, 18 and 20 are temporarily thrown over while the trimming condenser 6 is adjusted. These switches are then returned to the receiving attitude before final adjustment of the fine tuning control. The frequency of the received signal can then be read off from the calibration of the coarse and fine tuning controls. If the signal under examination is unmodulated, the C. W. beat oscillator must be brought into use. A valve voltmeter may be substituted for the detector and headphones as a means of detecting when the beat frequency is reduced to zero.

We claim:

1. A resonant circuit comprising an inductor, a variable capacitor connected in parallel with said inductor and producing equal changes in capacity for equal movements of its movable element, a series arrangement of a fixed capacitor and a second variable capacitor also connected in parallel with said inductor, means providing mechanical ganging between said variable capacitors, and a fourth capacitor connected in shunt to one of said series connected capacitors for changing the resonant frequency of said circuit, said variable capacitor in said series arrangement having a capacity-displacement characteristic producing unequal changes in capacity for equal movements of said ganging means, said unequal changes being such that a given variation in said fourth capacitor produces a constant change in the resonance frequency of the circuit irrespective of the setting of said ganged condensers.

2. A resonant circuit comprising an inductor of inductance L, a variable capacitor connected in parallel with said inductor and producing equal changes in capacity for equal movements of its movable element, a series arrangement of a fixed capacitor and a second variable capacitor also connected in parallel with said inductor, means providing mechanical ganging between said variable capacitors, a second fixed capacitor and means to connect said second fixed capacitor in parallel with said first fixed capacitor, said series-connected variable capacitor having a capacity-displacement characteristic such that its capacitance $C_2$ varies throughout its range of variation in accordance with the law:

$$C_2=\frac{A}{B}+\sqrt{\frac{A^2}{B^2}+\frac{C_3\cdot(C_3+C_4)}{B}}$$

where $$A=\frac{2C_3+C_4}{2}$$

$$B=\frac{C_4}{C}-1$$

$$C=\frac{1}{4\pi^2L}\left\{\frac{1}{f^2}-\frac{1}{(f+F)^2}\right\}$$

$C_3$=capacitance of the first fixed capacitor
$C_4$=capacitance of the second fixed capacitor
$f$=resonant frequency and F=fixed change of frequency effected by connecting the second fixed capacitor.

3. A resonant circuit comprising an inductor of inductance L, a variable capacitor connected in parallel with said inductor and producing equal changes in capacity for equal movements of its movable element, a series arrangement of a fixed capcitor and a second variable capacitor also connected in parallel with said inductor, means providing mechanical ganging between said variable capacitors, a second fixed capacitor and means to connect said second fixed capacitor in parallel with said series-connected variable capacitor, said series-connected variable capacitor having a capacity-displacement characteristic such that its capacitance $C_2$ varies throughout its range of variation in accordance with the law:

$$C_2=\sqrt{\frac{C_5^2}{4}+\frac{C_3^2\cdot C_5}{C}}-\left(C_3+\frac{C_5}{2}\right)$$

where $C_3$=capacitance of series-connected fixed capacitor
$C_5$=capacitance of second fixed capacitor $$C=\frac{1}{4\pi^2L}\left\{\frac{1}{f^2}-\frac{1}{(f+F)^2}\right\}$$

$f$=resonant frequency and

F=fixed change of frequency effected by connecting the second fixed capacitor.

4. A resonant circuit comprising an inductor, a coarsely-variable capacitor in parallel with said inductor, a series arrangement of a fixed capacitor and a finely-variable capacitor also connected in parallel with said inductor, and a third variable capacitor mechanically ganged to said coarsely-variable capacitor and connected in parallel with said finely-variable capacitor, said ganged capacitors having different capacity-displacement laws relating change in capacitance thereof with movement of said ganging means to produce a substantially constant change in resonant frequency of the circuit for any given change in the setting of the finely-variable capacitor irrespective of the setting of the coarsely-variable capacitor.

5. A resonant circuit comprising an inductor, a variable capacitor connected in parallel with said inductor, a series arrangement of a fixed capacitor and a second variable capacitor also connected in parallel with said inductor, means providing mechanical ganging between said variable capacitors, a second fixed capacitor, and means to connect said second fixed capacitor in parallel with the first said fixed capacitor, said variable capacitors having different capacity-displacement characteristics to produce different changes in capacity in response to movement of said ganging means so that actuation of said means to connect said second fixed capacitor in parallel with the first said fixed capacitor produces a constant change in the resonant frequency of the circuit irrespective of the setting of said ganging means.

6. A resonant circuit comprising an inductor, a variable capacitor connected in parallel with said inductor, a series arrangement of a fixed capacitor and a second variable capacitor also connected in parallel with said inductor, means providing mechanical ganging between said variable capacitors, second fixed capacitor, and means to connect said second fixed capacitor in parallel with said series-connected variable capacitor, said variable capacitors having different capacity-displacement characteristics to produce different changes in capacity in response to movement of said ganging means so that actuation of said means to connect said second fixed capacitor in parallel with said series-connected variable capacitor produces a constant change in the resonant frequency of the circuit irrespective of the setting of said ganging means.

LESLIE HERBERT BEDFORD.
ARTHUR HENRY ASHFORD WYNN.

REFERENCES CITED

The following references are of record in the file of this patent:

"Wireless World" for November 17, 1938.